US006760693B1

(12) United States Patent
Singh et al.

(10) Patent No.: US 6,760,693 B1
(45) Date of Patent: Jul. 6, 2004

(54) METHOD OF INTEGRATING COMPUTER VISUALIZATION FOR THE DESIGN OF A VEHICLE

(75) Inventors: Hatesh K. Singh, Canton, MI (US); Devang Desai, Farmington Hills, MI (US); Mehran Chirehdast, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 09/537,658

(22) Filed: Mar. 29, 2000

(51) Int. Cl.[7] .................................................. G06G 7/48
(52) U.S. Cl. ................................ 703/8; 703/6; 345/419
(58) Field of Search ..................... 703/2, 7, 8; 345/156, 345/420, 646, 419, 629, 418, 422, 423, 956, 428, 955, 473, 731, 771; 706/11, 45; 250/234

(56) References Cited

U.S. PATENT DOCUMENTS

| | | | |
|---|---|---|---|
| 4,696,225 A | 9/1987 | Weller ......................... 454/158 |
| 4,882,692 A | 11/1989 | Saxton et al. | |
| 4,912,657 A | 3/1990 | Saxon et al. | |
| 5,031,111 A | 7/1991 | Chao et al. ...................... 716/7 |
| 5,070,534 A | 12/1991 | Lascelles et al. | |
| 5,111,413 A | 5/1992 | Lazansky et al. | |
| 5,119,309 A | 6/1992 | Cavendish et al. | |
| 5,197,120 A | 3/1993 | Saxton et al. | |
| 5,291,748 A | 3/1994 | Ueda ............................ 62/179 |
| 5,293,479 A | 3/1994 | Quintero et al. | |
| 5,631,861 A | 5/1997 | Kramer .......................... 703/7 |
| 5,754,738 A | * 5/1998 | Saucedo et al. ............... 706/11 |
| 5,792,031 A | 8/1998 | Alton ........................... 482/78 |
| 5,793,382 A | 8/1998 | Yerazunis et al. .......... 345/474 |
| 5,799,293 A | 8/1998 | Kaepp | |
| 5,831,584 A | 11/1998 | Socks et al. .................... 345/8 |
| 5,846,086 A | 12/1998 | Bizzi et al. .................. 434/247 |
| 5,856,828 A | * 1/1999 | Letcher, Jr. .................. 345/420 |
| 5,920,320 A | * 7/1999 | Shimizu ....................... 345/422 |
| 5,921,780 A | 7/1999 | Myers ........................... 434/69 |
| 5,930,155 A | 7/1999 | Tohi et al. ...................... 703/8 |
| 5,953,517 A | 9/1999 | Yin et al. | |
| 5,963,891 A | 10/1999 | Walker et al. ............... 702/150 |
| 6,021,270 A | * 2/2000 | Hanaki et al. .................. 703/7 |
| 6,036,345 A | 3/2000 | Jannette et al. ............... 700/97 |
| 6,037,945 A | * 3/2000 | Loveland ..................... 345/420 |
| 6,084,590 A | * 7/2000 | Robotham et al. .......... 345/419 |
| 6,090,148 A | 7/2000 | Weber et al. | |
| 6,096,086 A | 8/2000 | Weber et al. | |
| 6,096,087 A | 8/2000 | Weber et al. | |
| 6,110,216 A | 8/2000 | Weber et al. | |
| 6,113,643 A | 9/2000 | Weber et al. | |

(List continued on next page.)

OTHER PUBLICATIONS

Seitz et al., "Toward Image based scene representation using view morphing", IEEE, 1996.*

(List continued on next page.)

*Primary Examiner*—Kevin J. Teska
*Assistant Examiner*—Kandasamy Thangavelu
(74) *Attorney, Agent, or Firm*—David B. Kelley

(57) ABSTRACT

A method of integrating computer visualization for the design of a vehicle includes the steps of determining a low-level geometric model of the vehicle and determining a modifiable parameter to modify the model of the vehicle. The method also includes the steps of morphing the model of the vehicle into a morphed model of the vehicle including the modifiable parameter using a computer visualization, and analyzing the morphed model of the vehicle using a computer aided engineering (CAE) analysis. The method further includes the steps of determining if the CAE analysis of the morphed model of the vehicle meets a predetermined criteria and using the morphed vehicle model in the design of the vehicle.

17 Claims, 4 Drawing Sheets

U.S. PATENT DOCUMENTS

| | | | |
|---|---|---|---|
| 6,113,644 A | 9/2000 | Weber et al. | |
| 6,119,125 A | 9/2000 | Gloudeman et al. | |
| 6,209,794 B1 | 4/2001 | Webster et al. | |
| 6,253,167 B1 | 6/2001 | Matsuda et al. | 703/11 |
| 6,273,724 B1 | 8/2001 | Roytman | 434/69 |
| 6,307,576 B1 * | 10/2001 | Rosenfeld | 345/956 |
| 6,415,851 B1 | 7/2002 | Hall et al. | 165/42 |
| 6,420,698 B1 * | 7/2002 | Dimsdale | 250/234 |
| 6,477,517 B1 * | 11/2002 | Limaiem et al. | 706/45 |
| 6,477,518 B1 | 11/2002 | Li et al. | 706/45 |
| 6,482,082 B1 | 11/2002 | Derleth et al. | 454/156 |
| 6,487,525 B1 | 11/2002 | Hall et al. | 703/7 |
| 6,510,357 B1 * | 1/2003 | Naik et al. | 700/98 |
| 6,556,196 B1 * | 4/2003 | Blanz et al. | 345/419 |
| 6,577,308 B1 * | 6/2003 | Ohto et al. | 345/423 |
| 6,636,234 B2 * | 10/2003 | Endo et al. | 345/646 |
| 2002/0000996 A1 * | 1/2002 | Trika | 345/629 |
| 2002/0140633 A1 | 10/2002 | Raffi et al. | 345/8 |
| 2003/0134676 A1 | 7/2003 | Kang | 463/36 |

OTHER PUBLICATIONS

Singh et al., "Shape recognition and vision based robotcontrol by shape morphing", IEEE, 1999.*

Purschke et al., "Virtual reality– New methods for improving and accelerating the development process in vehicle styling and design", IEEE 1998.*

Lehner et al, "Distributed virtual reality: Supporting remote collaboration in vehicle design", IEEE 1997.*

G. Anderson et al., "Computational Fluid Dynamics (CFD)", Engineering Designer, Mar.–Apr. 1997, Instn. Eng. Designers, United Kingdom, vol. 23, No. 2, pp. 16–17, XP008021114, ISSN: 0013–7898.

T. D. Hogg, "Rapid Prototyping Through Computational Fluid Dynamics (CFD)", Fifth International Conference on Factory 2000—The Technology Exploitation Process (Conf. Publ. No. 435), Cambridge, United Kingdom, Apr. 2–4, 1997, pp. 113–117, XP0002252364 1997, London, United Kingdom, IEE, United Kingdom ISBN: 0–85296–682–2.

Artificial Intelligence (Understanding Computers), by Time–Life Books, 1986, ISBN 0–8094–5675–3, pp. 36–43.

Juran on Quality by Design, by J.M. Juran, The Free Press, 1992, ISBN 0–02–916683–7, pp. 406–427, and 462–467.

The Computer Science and Engineering Handbook, by Allen B. Tucker, CRC Press, ISBN: 0–8493–2909–4, 1996, p. 1954.

Lafon, "Solid Modeling With Constraints and Parameterised Features", IEEE, Jul. 1998.

Jinsong et al., "Parametric Design with Intelligence Configuration Analysis Mechanism", IEEE, Nov. 1993.

Mateos et al., "Parametric and Associative Design of Cartridges for Special Tools", IEEE 1995.

"The Introduction of Knowledge based Engineering for Design for Manufacture in the Automotive Industry", G.S. Wallace, Successful Cases of Integrated Product Design with Manufacturing Technology (Digest No: 1997/168), IEE Colloquium on, pp. 7/1–7/5, May 1997.

"Knowledge Based Total Product Engineering", A.P. Harper, Successful Cases of Integrated Product Design with Manufacturing Technology (Digest No: 1997/168), IEE Colloquium on, pp. 5/1–5/2, May 1997.

"Interactive Graphics Package For Human Engineering And Layout Of Vehicle Workspace", Gerald F. Rabideau and James Farnady, Department of Systems Design, University of Waterloo, Waterlloo, Ontario, Canada, 1976.

"Simulation–Aided Design of Man/Machine Interfaces in Automated Industries", Gary I. Davis and James R. Buck, School of Industrial Engineering, Purdue University, West Lafayette, Indiana, 1981.

"RAPID: Prototyping Control Panel Interfaces", Karl Freburger, OOPSLA '87 Proceedings, Oct. 4–8, 1987.

SAE Recommended Practice, "Motor Vehicle Dimensions—SAE J11", Jun. 1993.

M. E. Gleason et al., "Automative Climate Control Simulation Using CFD", Cray Channels, vol. 16, No. 2, 1994, pp. 4–7, XP008018557.

E. Augier, "Numerical and Experimental Study of Airflow In A HVAC Module", International Symposium on Automotive Technology and Automation, Jun. 3, 1996, pp. 59–66, XP008018546.

J. Currie, "Application of Computational Fluid Dynamics for the Optimization of Air Ducts", Isata 29th International Symposium on Automotive Technology and Automation, Proceedings of Conference on Supercomputer Applications in the Transportation Industries, Florence, Italy, Jun. 3–6, 1996, pp. 115–123, XP008021112 1996, Croydon, United Kingdom Automotive Autom, United Kingdom.

* cited by examiner

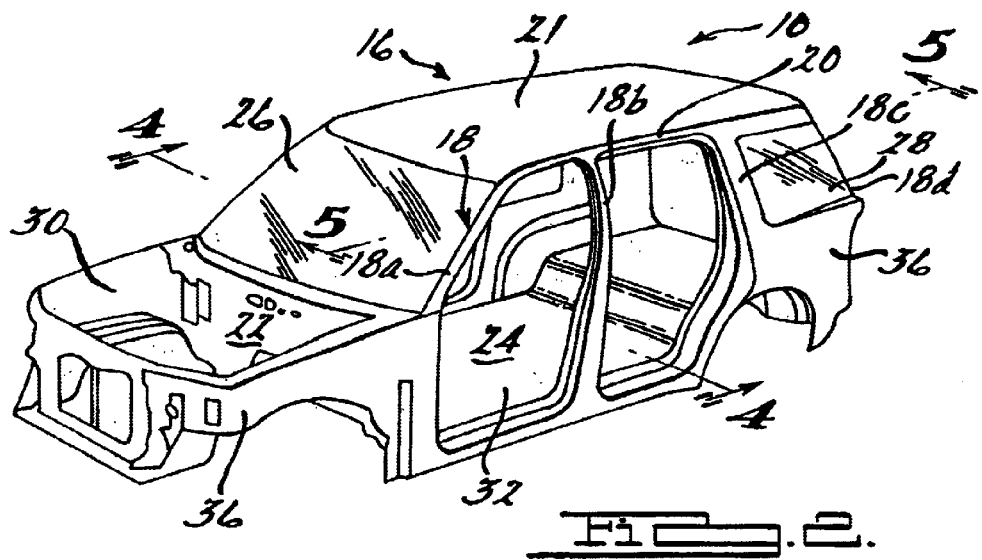
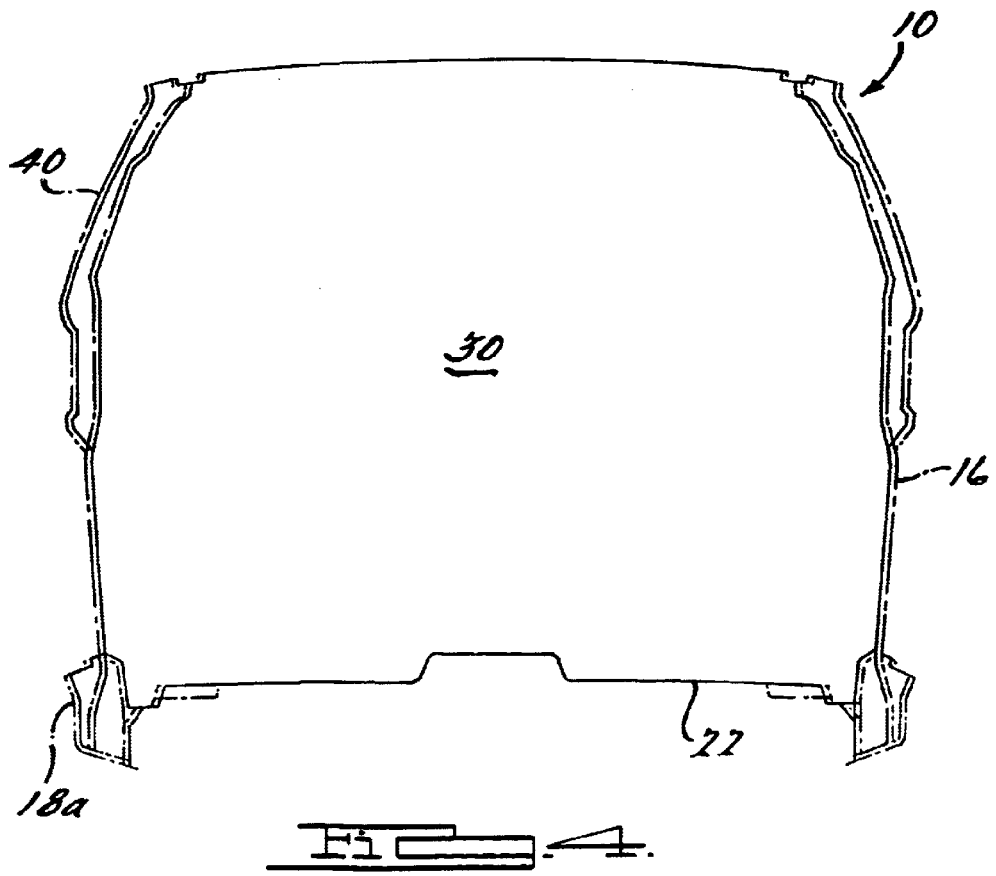

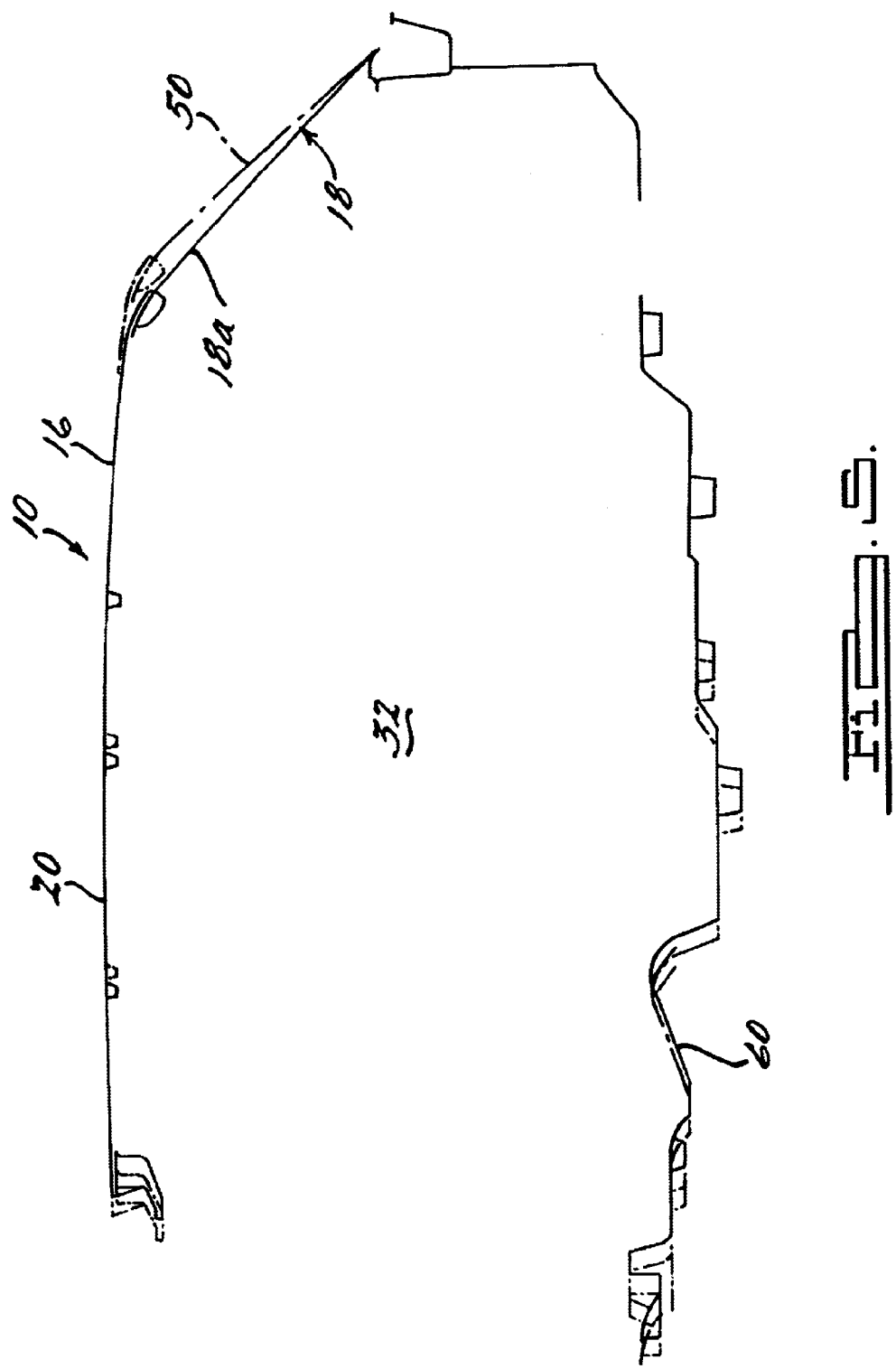

METHOD OF INTEGRATING COMPUTER VISUALIZATION FOR THE DESIGN OF A VEHICLE

BACKGROUND OF THE INVENTION

1. Field of the Invention

The present invention relates generally to design of a vehicle and, more specifically, to a method of integrating computer visualization for the design of a vehicle.

2. Description of the Related Art

Vehicle design, and in particular automotive vehicle design, has advanced to a state in which computer-aided design techniques are frequently utilized to develop a new vehicle in a virtual environment. Computer-aided design is especially beneficial in the product development process, to optimize the various systems incorporated within a vehicle, and to enhance the design and functional capabilities of these vehicle systems.

Several computer-aided design software programs are generally known and commercially available. The design generated by the computer-aided design software program typically provides a user with a model for visualization and measurement purposes. The design is represented either by points, polygons, surface models, solid models or non-geometric representations that illustrate the design concept. A surface or solid model is a high-level geometric representation of the design concept. The high-level geometric model is a mathematically complex model involving higher order polynomial equations.

Traditionally, the high-level geometric model of the design concept is generally used for computer aided engineering, manufacturing and other engineering evaluation purposes. However, the magnitude of geometric complexity necessary for this type of model renders it time consuming to create, especially for a system as complex as a vehicle. Furthermore, modifications to a high-level geometric model are difficult to implement, especially in a timely manner.

A design represented by points or polygons is a low-level geometric model of the design concept. The low-level geometric model is simple to create, but still difficult to modify relative to a high-level geometric model. Creation is easier because of its reduced mathematical complexity. The low-level geometric model is similarly useful for various manufacturing or engineering purposes depending on the desired solution, as is known in the art.

A non-geometric model, for example, of the design concept is faster to create and modify than a high-level geometric model due to its simplicity, but does not provide adequate geometric data for engineering assessment purposes.

One technique for visually modifying a model using computer aided design software is known in the art as computer visualization or morphing. Morphing is the transformation of one form into another form by compression, stretching, bending or rotating the model of the original form. While morphing techniques work for a simple system represented by low-level geometry, they are time consuming and cumbersome for a complex structure, such as a model of a vehicle, represented by a mathematically complex high-level geometry. Therefore, morphing techniques have not been used for structural analysis purposes. In the past, morphing has been used for graphic design. In graphic design, the main function of the geometric data is to block or reflect a light source to convey a surface or image to a user. In structural design, the data representing an object should be mathematically connected such as by forming a continuous surface or solid. As the surfaces are manipulated, data from different parts should maintain a physical separation. Also, the data for the object should not self-intersect to create a non-manufacturable condition. These restrictions constrain the application of morphing techniques for structural design and data manipulation purposes.

Thus, there is a need in the art to provide a method of integrated computer visualization with the design of a vehicle that creates a low-level geometric model of the vehicle design that is easily modified in a time-efficient manner and can be integrated into a high-level geometric model of the design for further complex assessment purposes.

SUMMARY OF THE INVENTION

Accordingly, the present invention is a method of integrating computer visualization for the design of a vehicle. The method includes the steps of determining a low-level geometric model of the vehicle and determining a modifiable parameter to modify the model of the vehicle. The method also includes the steps of morphing the model of the vehicle into a morphed model of the vehicle including the modifiable parameter using a computer visualization and analyzing the morphed model of the vehicle using a computer aided engineering (CAE) analysis. The method further includes the steps of determining if the CAE analysis of the morphed model of the vehicle meets a predetermined criteria and using the morphed vehicle model in the design of the vehicle.

One advantage of the present invention is that a new method of integrating computer visualization for the design of a vehicle is provided that uses a morphing computer-aided design technique to considerably reduce overall design time and related expenses. Another advantage of the present invention is that the method utilizes a low-level geometric model of the vehicle to quickly evaluate a proposed design modification. Still another advantage of the present invention is that the method creates a visual morphed model of the vehicle that includes a proposed design modification. Yet still another advantage of the present invention is that the method supports computer-aided engineering analysis for assessment purposes. A further advantage of the present invention is that the method enhances flexibility in design, while still meeting vehicle timing considerations. Still a further advantage of the present invention is that the method utilizes computer visualization technology to modify a computer-aided design of a vehicle concept in light of predetermined criteria.

Other features and advantages of the present invention will be readily appreciated as the same becomes better understood after reading the subsequent description when considered in connection with the accompanying drawings.

BRIEF DESCRIPTION OF THE DRAWINGS

FIG. 2 is a plan view of a vehicle.

FIG. 4 is a sectional view taken along line 4—4 of FIG. 2, illustrating increasing a track width using the method of FIG. 3.

FIG. 5 is a sectional view taken along line 5—5 of FIG. 2 illustrating modifying an A-pillar angle and increasing a wheelbase length using the method of FIG. 3.

DESCRIPTION OF THE PREFERRED EMBODIMENT(S)

Vehicle design is achieved according to the present invention with a generic parametric driven design process. Advantageously, this process allows flexibility in vehicle design and engineering analysis of the vehicle design in a fraction of the time required using conventional design methods. Various computer-based tools are integrated to achieve this enormous time and expense savings, including solid modeling, parametric design, automated studies and a knowledge-based engineering library.

Figure 1:
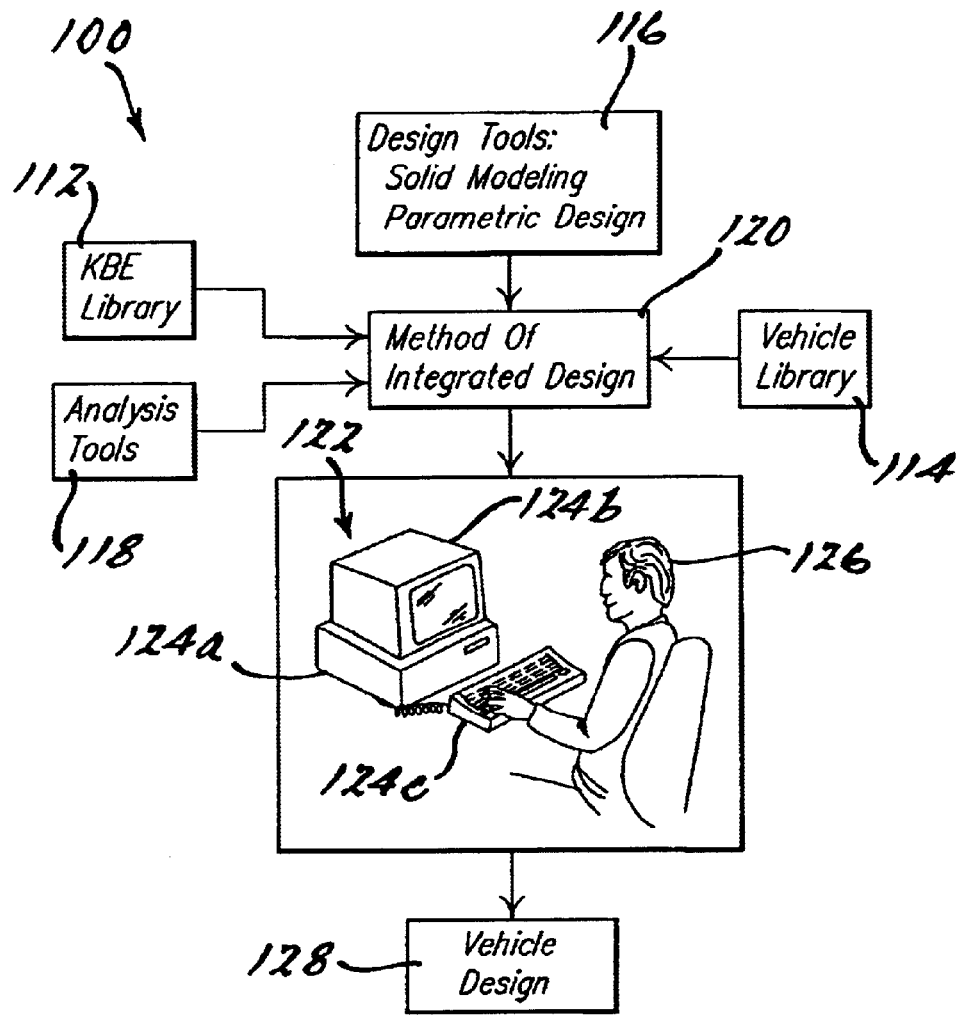
FIG. 1 is a block diagram of a system which may be utilized with a method of integrating computer visualization for the design of a vehicle, according to the present invention.

Referring to the drawings and in particular FIG. 1, the tools 100 used by a method of integrating computer visualization for the design of a vehicle, according to the present invention, are illustrated graphically. The tools 100 include a knowledge-based engineering library 112 stored on an electronic storage device (not shown). The knowledge-based engineering library 112 is a database of sub-libraries providing an electronic representation of various experts' knowledge of information relevant to the design of the vehicle. The knowledge-based engineering library 112 may also contain information in electronic form regarding various types of vehicle subsystems. The knowledge-based engineering library 112 may further contain predetermined product assumptions regarding the vehicle to be designed such as model year, body style or production volume.

The knowledge-based engineering library 112 may include a sub-library such as a component parts library of particular component parts used on a vehicle. The component parts sub-library may contain information such as a parametric solid model of a particular component part, as well as parameters defining attributes of the component part. A user 126 may select an attribute that is relevant to the design of a vehicle 10 to be described. For example, a relevant attribute may include a body style, frame configuration, or engine type (not shown).

The tools 100 also include a vehicle library 114 stored on the electronic storage device. The vehicle library 114 is an electrical representation of a vehicle model or a portion thereof. Advantageously, the vehicle library 114 may contain a parametric solid model of an exterior portion of a particular vehicle 10 (to be described). In this example, the vehicle library 114 may include a parametric model of an exterior body portion of the vehicle 10. Also, the vehicle library 114 may contain parameters defining various vehicles and vehicle system characteristics, such as interior size and vehicle body style. It should be appreciated that the vehicle library 114 may be a sub-library of the knowledge based engineering library 112.

The tools 100 may also include various computer-aided design (CAD) tools 116, which can be used for the design method, to be described. These design tools 116 may include solid modeling, visualization and parametric design techniques. Solid modeling, for example, takes electronically stored vehicle model data from the vehicle library 114 and standard component parts data from the knowledge-based engineering library 112 and builds complex geometry for part-to-part or full assembly analysis. Several modeling programs are commercially available and generally known to those skilled in the art.

The parametric design technique is used in the electronic construction of vehicle geometry within a computer system 122, to be described, for designing the vehicle 10 or component part on the vehicle 10. As a particular dimension or parameter is modified, the computer system 122 is instructed to regenerate a new vehicle or component part geometry.

The visualization design technique provides for the visual modification of a point or a group of points from the same or different component parts in a design using an interactive device such as a mouse. The design is regenerated using the modified data point, such that a new geometric representation of the design is generated. One example of a visualization design technique to change a design is morphing. Several morphing programs are commercially available for graphic design purposes and generally known to those skilled in the art. Additionally, these morphing techniques work more efficiently with a low-level geometric model than a high-level geometric model typically used for structural design.

The tools 100 also include various computer-aided engineering (CAE) analysis tools 118. One example of a CAE analysis tool 118 is computational fluid dynamics (CFD). Another example of a CAE analysis tool 118 is finite element analysis (FEA). Still another example of a CAE analysis tool 118 is an ergonomic study. Several software programs are commercially available to perform these analyses and are generally known to those skilled in the art.

The tools 100 further include the computer system 122, as is known in the art, to implement a method 120 to be described to integrate computer visualization with the design of the vehicle 10. The computer system 122 includes a processor and a memory 124a, which can provide a display and animation of a system, such as the vehicle 10, on a display such as a video terminal 124b.

In this example, the information is displayed on the video terminal 124b in a series of screens, also referred to in the art as a browser. Selection and control of the information for the design can be achieved by the user 126, via a user interactive device 124c, such as a keyboard or a mouse. The user 126 inputs a set of parameters and set of instructions into the computer system 122 when prompted to do so. The set of parameters and the set of instructions may be product specific, wherein other data and instructions non-specific to the product may already be stored in the memory 124a.

One example of an input method is a pop-up screen containing available information or instructions, including an on-line description for the parameter and a current value therefore. For example, parametric values may be chosen from a table within a two-dimensional mode, since some vehicle designers prefer to view an assembly in sections which can be laid out on a drawing.

The computer system 122 utilizes the set of information or instructions from the user 126, and any other information regarding related vehicle systems and information from the libraries 112, 114, design tools 116 and analysis tools 118, for method 120, discussed in detail subsequently.

Advantageously, the computer implemented method of integrating computer visualization with the design of the vehicle 10, to be described, combines all of the foregoing to provide an efficient, flexible, rapid design of the vehicle 10. Further, a vehicle design 128 is an output of the method 120 and the vehicle design 128 is available for further analysis and study.

Referring to FIG. 2, a model of a vehicle 10, and in particular an automotive vehicle, is illustrated. The vehicle 10 includes a vehicle frame (not shown). The frame includes a pair of rails (not shown) disposed in a spaced relationship to one another and defining a longitudinal axis of the vehicle 10. The vehicle 10 also includes a front axle (not shown) and rear axle (not shown) disposed in a spaced relationship to one another and extending substantially transverse to the longitudinal axis of the vehicle 10. It should be appreciated that wheels (not shown), as is known in the art, are operatively mounted to the front axle and rear axle, for rolling engagement with a surface such as a road. It should also be appreciated that the distance between the front axle and rear axle is referred to in the art as the wheelbase, and the distance between the pair of front wheels or rear wheels is referred to as the track width.

The vehicle 10 also includes a vehicle body 16 which defines the shape of the vehicle 10, as is known in the art, and includes components typically associated with the vehicle body 16. The vehicle body 16 includes structural members which form a load bearing structure for the vehicle 10. One example of a structural member is a pillar 18. In this example, there are four pairs of vertically extending pillars 18 attached to the frame, which are referred to in the art as A, B, C, and D-pillars, 18a, 18b, 18c, 18d respectively. Another example of a structural member is a pair of roof rails 20 that form the roof line of the vehicle 10. The roof rails 20 are disposed in spaced relationship to one another and extend therealong the longitudinal axis of the vehicle body 16. A generally planar roof panel 21 is supported between the roof rails 20. Another example of a structural member is a dash or instrument panel 22, which forms a generally planar surface extending between the A-pillars 18a. A further example of a structural member is a floor 24 having a generally planar shape, as is known in the art. The vehicle body includes a windshield 26, and other windows 28, as is known in the art.

The vehicle body 16 includes a front storage compartment 30, referred to as an engine compartment, which forms the general shape of the front of the vehicle 10. The vehicle body 16 further includes an occupant compartment 32 to accommodate vehicle occupants (not shown). It should also be appreciated that the instrument panel 22, roof 21, floor 24 and pillar 18 cooperatively define the interior space of the vehicle 10 referred to as the occupant compartment 32. The occupant compartment 32 includes a number of seats (not shown) for the occupants and control mechanisms (not shown) to operate the vehicle 10. The vehicle body 16 also includes a rear storage compartment 34, as is known in the art, forming the shape of the rear of the vehicle 10.

The vehicle body 16 includes a plurality of generally planar interconnected body panels 36 secured thereto using a conventional means such as welding or fastening. Advantageously, the body panels 36 further define an aesthetically pleasing shape of the vehicle 10.

Figure 3:
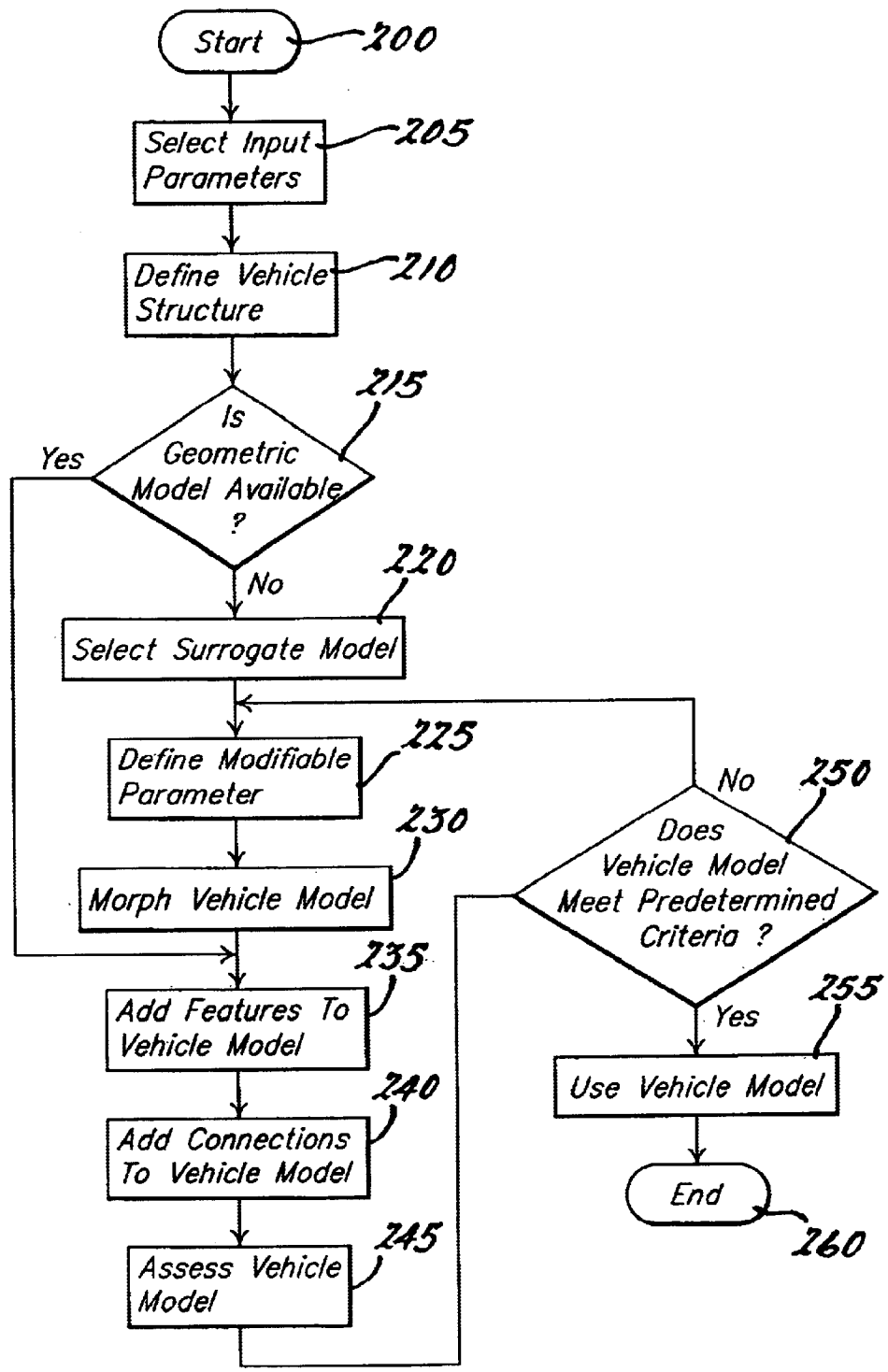
FIG. 3 is a flowchart of a method of integrating computer visualization for the design of a vehicle, according to the present invention.

Referring to FIG. 3, a flowchart of a method of integrating computer visualization for the design of the vehicle 10, according to the present invention, is illustrated. It should be appreciated that the design process typically encompasses several overlapping phases, such as design initiation, development assessment and verification. Various design tools 116 are utilized to carry out the design process. Advantageously, the method of integrated computer design of the vehicle 10 bridges the gap between computer-aided design and computer-aided engineering. The method begins in bubble 200 and advances to block 205.

In block 205, the user 126 selects an input parameter that defines the architecture or configuration of the design of the vehicle 10. An example of an input parameter is information regarding the type of vehicle 10, such as passenger car, truck, or sport utility as in this example. Another example of an input parameter is a dimensional reference such as vehicle length, width or height. Still another example of an input parameter is a cost target for a particular component part. Preferably, the input parameter is obtained from information maintained in a computer database, such as the knowledge-based engineering library 112. The methodology advances to block 210.

In block 210, the user 126 defines a vehicle body structure with respect to the input parameter. The vehicle body structure is a low-level geometric model represented by digital data points or polygons, as is known in the art. For example, the user 126 may define an existing vehicle body structure from the vehicle library 114 which embodies the architectural intent of the vehicle 10 to be designed. The vehicle body structure may also be a new vehicle body structure obtained from a digital scan of a clay styling model of the exterior of the vehicle, as is known in the art. Further, the vehicle body structure may be an assemblage of various portions of existing body structures. In this example, each component part contained within the vehicle body structure is organized within the memory 124a of the computer system 122 in a hierarchal data tree structure, as is known in the art. The methodology advances to diamond 215.

In diamond 215, the methodology determines if a geometric model is available of the vehicle body structure, including component parts located therein, for the low-level geometric model of the vehicle 10. If the geometric model for the vehicle body structure is available, the geometry is used for the design of the vehicle and the methodology advances to block 235, to be described. If the geometric model is not available, the methodology advances to block 220.

In block 220, the user 126 selects a surrogate model of the vehicle body structure. Preferably, the surrogate model is an existing model that meets the architectural intent of the defined vehicle body structure in light of the input parameters. The surrogate model is architecturally correct, but may not be dimensionally accurate. In this example, the component parts within the data tree structure in the memory 124a of the computer system 122 are represented by either new geometry or surrogate geometry. The methodology advances to block 225.

In block 225, the user 126 defines a modifiable parameter by identifying the modifiable parameter and inputting information regarding the modifiable parameter into the computer system 122. It should be appreciated that the modifiable parameter may represent a proposed design intent for the design of the vehicle 10. An example of a modifiable parameter is to increase the track width between the rails of the frame a predetermined amount. The effect of such a change on the vehicle body 16 is shown at 40 in FIG. 4. Another example of a modifiable parameter is to increase the angle of the A-pillar 18a as shown at 50 in FIG. 5. Still another example of a modifiable parameter is to increase the wheelbase a predetermined amount as shown at 60 in FIG. 5. A further example of a modifiable parameter is for the user 126 to superimpose another model of a vehicle or portion thereof, over the current model of the vehicle 10. Advantageously, the user inputs the modifiable parameter into the computer system 122, such as by using a visual technique or other input technique. For example, the user 126 may drag a point on the model to a new location using the user interactive device 124c. Likewise, the user 126 may change a previously defined input parameter. The methodology advances to block 230.

In block 230, the methodology modifies the low-level geometric model of the vehicle 10 based on the modifiable parameter, such as by using a morphing technique, as is known in the art, to create a morphed vehicle model. It should be appreciated that the methodology checks for component part-to-part interferences within the morphed vehicle model. The methodology advances to block 235.

In block 235, the user 126 adds additional features to the morphed vehicle model using the knowledge based engineering library 112 of existing features, if required for structural, packaging or manufacturing purposes. An example of a feature is a boss, bead or an aperture. The methodology advances to block 240.

In block 240, the methodology establishes structural connection locations for joining body panels 36 within the morphed vehicle model. For example, weld joints for joining two body panels within the morphed vehicle model are identified. The methodology advances to block 245.

In block 245, the methodology assesses the morphed vehicle model using a computer-aided engineering analysis tool 118. For example, a computer aided engineering analysis tool 118, such as finite element analysis, may be used to determine if a predetermined structural criteria for the morphed vehicle model is satisfied. An ergonomic packaging analysis may be conducted to determine if a predetermined packaging criteria is met. Advantageously, the morphed low-level geometric model can be evaluated and modified more expeditiously than a high-level geometric model. The methodology advances to diamond 250.

In diamond 250, the methodology determines if the morphed vehicle model meets a predetermined criteria. An example of a predetermined criteria is a desired load capacity. Another example of a predetermined criteria is an occupant compartment noise level. If the predetermined criteria is not satisfied, the methodology returns to block 225 and continues. Returning to diamond 250, if the predetermined criteria is satisfied, the methodology continues to block 255.

In block 255, the methodology uses the morphed vehicle model and a CAD design tool 116 to generate a high-level geometric model of the vehicle representing a solid model or surface model of the morphed vehicle design. Advantageously, the high-level geometric model of the vehicle 10 is available for further analysis by other disciplines, such as manufacturing, cost-assessment, or engineering, whereby a high-level geometric model is advantageous. The methodology advances to bubble 260 and ends.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A method of integrating computer visualization for the design of a vehicle comprising the steps of:

determining a low-level geometric model of the vehicle;

determining a modifiable parameter to modify the model of the vehicle;

morphing the model of the vehicle into a morphed model of the vehicle including the modifiable parameter using a computer visualization;

analyzing the morphed model of the vehicle using a computer aided engineering(CAE)analysis;

determining if the CAE analysis of the morphed model of the vehicle meets a predetermined criteria; and using the morphed vehicle model in the design of the vehicle.

2. A method as set forth in claim 1 wherein said step of determining a low-level geometric model includes the step of selecting an input parameter from a library stored in a memory of a computer system.

3. A method as set forth in claim 1 wherein said step of determining a low-level geometric model includes the step of selecting a vehicle body structure from a library stored in a memory of a computer system.

4. A method as set forth in claim 1 wherein said step of determining a low-level geometric model includes the step of determining if a geometric model of each component part is available, and using the geometric model of the component part if available.

5. A method as set forth in claim 1 wherein said step of determining a low-level geometric model includes the step of selecting a surrogate geometry for a component part within the low-level geometric model.

6. A method as set forth in claim 1 including the step of adding a component part feature to the morphed model of the vehicle from a library stored in a memory of a computer system after the step of morphing.

7. A method as set forth in claim 1 including the step of identifying a structural connection joint for adjoining body panels within the morphed model of the vehicle after the step of morphing.

8. A method as set forth in claim 1 including the step of using the morphed vehicle model to generate a high-level geometric model of the vehicle.

9. A method of integrating computer visualization for the design of a vehicle comprising the steps of:

selecting an input parameter from a library stored in a memory of a computer system;

determining a low-level geometric model of the vehicle by selecting a vehicle body structure from the library using the input parameter;

determining a modifiable parameter to modify the model of the vehicle;

morphing the model of the vehicle into a morphed model of the vehicle including the modifiable parameter using a computer visualization;

analyzing the morphed model of the vehicle using a computer aided engineering (CAE)analysis;

determining if the CAE analysis of the morphed model of the vehicle meets a predetermined criteria; and using the morphed vehicle model to generate a high-level geometric model of the vehicle.

10. A method as set forth in claim 9 wherein the input parameter defines an architecture for a design of the vehicle.

11. A method as set forth in claim 9 wherein said step of determining a low-level geometric model includes the step of selecting a surrogate geometry for a component part within the low-level geometric model.

12. A method as set forth in claim 9 wherein said step of determining a low-level geometric model includes the step of determining if a geometric model of each component part is available, and using the geometric model of the component part if available.

13. A method as set forth in claim 9 including the step of adding a component part feature to the morphed model of the vehicle from the library after the step of morphing.

14. A method as set forth in claim 9 including the step of identifying a structural connection joint for adjoining body panels within the morphed model of the vehicle after the step of morphing.

15. A method of integrating computer visualization for the design of a vehicle comprising the steps of:

selecting an input parameter from a library stored in a memory of a computer system, wherein the input parameter defines an architecture for a design of the vehicle;

determining a low-level geometric model of the vehicle by selecting a vehicle body structure from the library using the input parameter;

determining if geometry for a component part within the vehicle body structure is available, and selecting a surrogate geometry for the component part if not available;

determining a modifiable parameter to modify the model of the vehicle;

morphing the model of the vehicle into a morphed model of the vehicle including the modifiable parameter using a computer visualization;

analyzing the morphed model of the vehicle using a computer aided engineering (CAE) analysis;

determining if the CAE analysis of the morphed model of the vehicle meets a predetermined criteria; and using the morphed vehicle model to generate a high-level geometric model of the vehicle.

16. A method as set forth in claim 15 including the step of adding a component part feature to the morphed model of the vehicle from the library after the step of morphing.

17. A method as set forth in claim 15 including the step of identifying a structural connection joint for adjoining body panels within the morphed model of the vehicle after the step of morphing.

* * * * *